025

(12) United States Patent
Kim et al.

(10) Patent No.: US 7,447,095 B2
(45) Date of Patent: Nov. 4, 2008

(54) MULTI-PORT MEMORY DEVICE

(75) Inventors: Jae-Il Kim, Kyoungki-do (KR); Chang-Ho Do, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/529,202

(22) Filed: Sep. 27, 2006

(65) Prior Publication Data

US 2007/0073982 A1 Mar. 29, 2007

(30) Foreign Application Priority Data

Sep. 28, 2005 (KR) .................. 10-2005-0090839
Aug. 23, 2006 (KR) .................. 10-2006-0079676

(51) Int. Cl.
*G11C 7/00* (2006.01)
*G11C 7/10* (2006.01)
*G11C 8/00* (2006.01)

(52) U.S. Cl. .................. 365/220; 365/189.05; 365/196; 365/230.03; 365/230.05; 365/230.06

(58) Field of Classification Search ............... 365/220, 365/230.03, 230.05, 230.06
See application file for complete search history.

(56) References Cited

U.S. PATENT DOCUMENTS

2007/0070743 A1* 3/2007 Do et al. ............... 365/201

2007/0070778 A1* 3/2007 Do ....................... 365/230.05

FOREIGN PATENT DOCUMENTS

KR 1020000053662 A 8/2000

* cited by examiner

*Primary Examiner*—Ly D Pham
(74) *Attorney, Agent, or Firm*—Blakely, Sokoloff, Taylor & Zafman

(57) ABSTRACT

A multi-port memory device having a plurality of ports performing a serial input/output (I/O) communication with external devices, and a plurality of banks performing a parallel I/O communication with the ports through a plurality of global I/O lines. The multi-port memory device includes: a write clock generating unit for generating a write clock selectively toggled only while write data are applied; a write control unit for generating a write flag signal group and a write driver enable signal in response to the write clock and a write command; a data latch unit for outputting intermediate write data by storing burst write data under the control of the write flag signal group; and a write driver for receiving the intermediate write data to write final write data in a memory cell of a corresponding bank in response to the write driver enable signal and a data mask signal group.

24 Claims, 13 Drawing Sheets

FIG. 3A
(RELATED ART)

| 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|----|----|----|----|----|----|----|----|----|----|
| PHY | | CMD | ACT | WT | PCG | UDM | | | | BANK | | | | COLUMN ADDRESS | | | | | |
| 1 | 1 | 1 | 0 | 1 | PCG | $4^{th}$ | $3^{rd}$ | $2^{nd}$ | $1^{st}$ | 3 | 2 | 1 | 0 | 5 | 4 | 3 | 2 | 1 | 0 |

FIG. 3B
(RELATED ART)

| 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|----|----|----|----|----|----|----|----|----|----|
| PHY | | CMD | LDM | UPPER BYTE | | | | | | | | LOWER BYTE | | | | | | | |
| 1 | 1 | 0 | LDM | 7 | 6 | 5 | 4 | 3 | 2 | 1 | 0 | 7 | 6 | 5 | 4 | 3 | 2 | 1 | 0 |

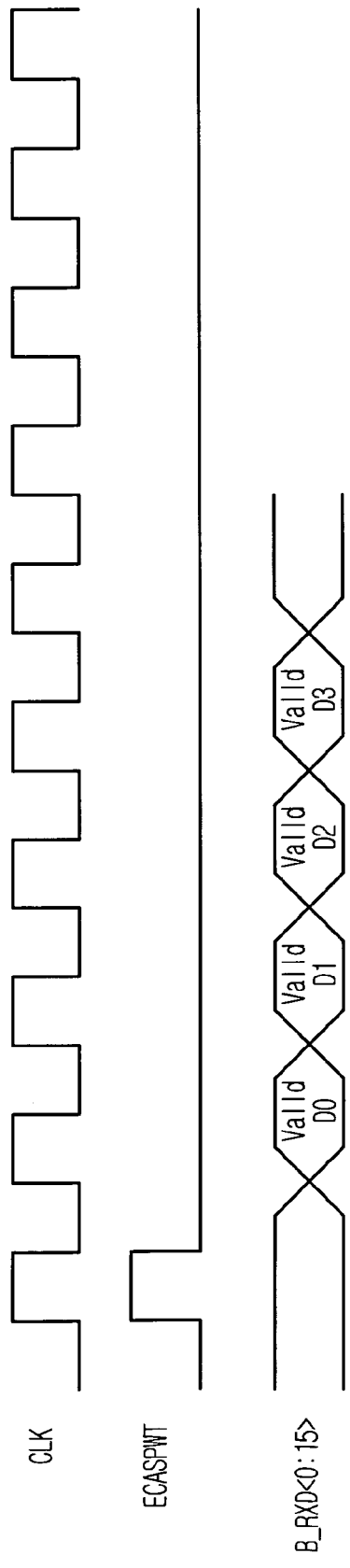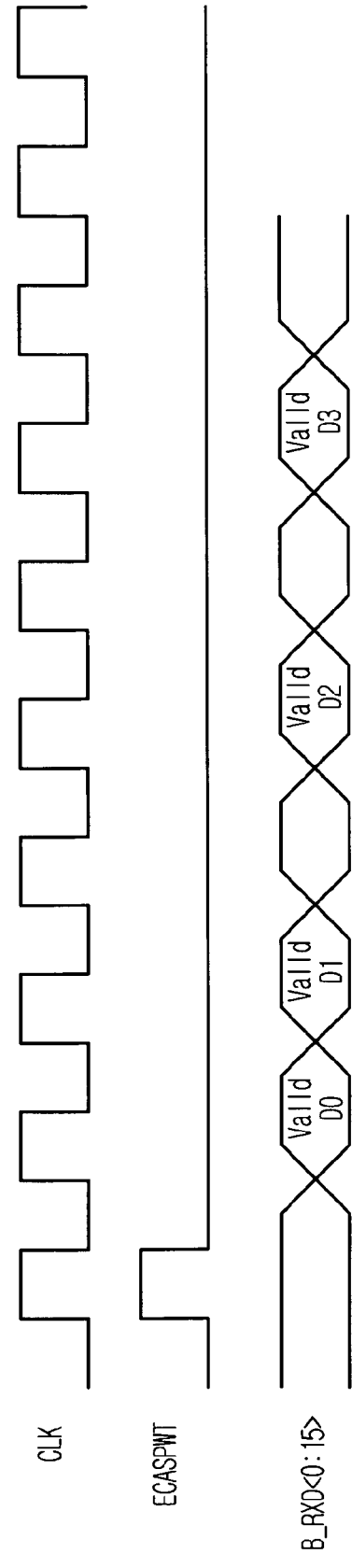

MULTI-PORT MEMORY DEVICE

FIELD OF THE INVENTION

The present invention relates to a multi-port memory device, and more particularly, to a bank control logic unit of a multi-port memory device for supporting a preemption burst write operation and an interrupt write operation as well as a normal write operation.

DESCRIPTION OF RELATED ARTS

Currently, most dynamic random access memory (DRAM) are used in a high definition television (HDTV) and a liquid crystal display (LCD) TV as well as traditional devices such as a desktop computer, a notebook computer and a server. Accordingly, there is a demand for a new data communication instead of a conventional data communication having a single port with a plurality of input/output (I/O) pin sets, i.e., a parallel I/O interface.

FIG. 1 is a block diagram of a conventional single port memory device. For convenience of explanation, a conventional x16 512 M DRAM device having eight banks as the single port memory device is illustrated.

The x16 512 M DRAM device includes a plurality of memory cells, first to eighth banks BANK0 to BANK7, a single port PORT, and a plurality of global input/output (I/O) data buses GIO. The plurality of memory cells is arranged with a plurality of N×M memory cells having a matrix form, the M and N being positive integers. The first to eighth banks BANK0 to BANK7 includes a row/column decoder for selecting a specific memory cell by row and column lines. The single port PORT controls signals inputted from or outputted to the first to eighth banks BANK0 to BANK7. The global I/O data buses GIO transfers signals between the single port and the banks, and between the single port and input/output (I/O) pins. Referring to FIG. 1, the global I/O data buses GIO include a control bus, fifteen address buses and sixteen data buses.

As described above, the single port memory device includes only a single port with a plurality of I/O pin sets for transferring data signals between the single port memory device and external devices via an external chipset.

A process for transferring signals from the banks to the external devices is described. The signals outputted from the first to eighth banks BANK0 to BANK7 through the sixteen data buses are transferred to the external devices in parallel through the external chipset by way of the single port PORT.

A process for transferring signals from the external devices to the banks is described. The signals outputted from the external devices in parallel through the external chipset are transferred to the single port PORT, and then are transferred to the first to eighth banks BANK0 to BANK7 through the sixteen data buses. The transferred signals are transferred to the memory cells under the control of a control unit provided within the banks, e.g., a decoder and a driver.

Meanwhile, the signals transferred to the external devices from the first to eighth banks BANK0 to BANK7 include an address and a command as well as data signals. The address and command are transferred to the single port PORT from the external devices in parallel via extra input/output address and command pins except for the sixteen data buses. The command transferred to the single port PORT is inputted to the banks through the single control bus, and the address transferred to the single port PORT is inputted to the banks through the fifteen address buses.

However, in the single port memory device, it is difficult to implement various multimedia functions because the single port memory device uses only one port. To implement the various multimedia functions in the single port memory device, each DRAM device has to be constituted independent of each other so as to perform its unique function. When the DRAM devices are constituted independent of each other, it is difficult to allocate a proper memory amount between memory devices based on the number of access times. As a result, an efficiency of utilization to density of the whole memory device is decreased.

For reference, detailed description is provided in the specification of the Korea Patent applications, Korea application No. 2006-0032948, filed on Apr. 11, 2006, entitled "MULTI-PORT MEMORY DEVICE WITH SERIAL INPUT/OUTPUT INTERFACE", and Korea application No. 2005-0090936, filed on Sep. 29, 2005 as a priority application of the Korea application No. 2006-0032948. They are incorporated herein by reference.

FIG. 2 is a block diagram of a multi-port memory device described in accordance with Korea application No. 2006-0032948. For convenience of explanation, the multi-port memory device having four ports and eight banks is illustrated. Particularly, it is assumed that the multi-port memory device has a 16-bit data frame and performs a 64-bit prefetch operation.

The multi-port memory device includes first to fourth ports PORT0 and PORT3, first to eighth banks BANK0 to BANK7, first and second global input/output (I/O) data buses GIO_OUT and GIO_IN, first to eighth bank control logic units BCL0 to BCL7, and a phase locked loop (PLL) 101.

Each of the first to fourth ports PORT0 and PORT3 located at a center of a core is arranged in a row direction, and performs a serial data communication with its own external device independent of each other. The first to eighth banks BANK0 to BANK7 are divided into upper banks BANK0 to BANK3 and lower banks BANK4 to BANK7 based on the first to fourth ports PORT0 to PORT3 and arranged in the row direction.

The first global I/O bus GIO_OUT is arranged in the row direction between the upper banks BANK0 to BANK3 and the first to fourth ports PORT0 to PORT3, and transmits output data in parallel. The second global I/O bus GIO_IN is arranged in the row direction between the lower banks BANK4 to BANK7 and the first to fourth ports PORT0 to PORT3, and transmits input data in parallel.

The first to eighth bank control logic units BCL0 to BCL7 control a signal transmission between the first and second global I/O buses GIO_OUT and GIO_IN and the first to eighth banks BANK0 to BANK7.

The PLL 101 is located between the second port PORT1 and the third port PORT2 and generates an internal clock for synchronizing internal commands and I/O data applied to the first to fourth ports PORT0 to PORT3.

FIG. 3A is a frame format showing an inputted write command frame, and FIG. 3B is a frame format showing an inputted write data frame. The frame format is a protocol for transferring signals.

Referring to FIG. 3A, the write command frame is a unit of 20-bit serialized signals inputted from external devices. $18^{th}$ and $19^{th}$ bits PHY among the 20-bit serialized signals correspond to a physical link coding bit, a $17^{th}$ bit CMD means a command start point, a $16^{th}$ bit ACT corresponds to an active command, a $15^{th}$ bit WT corresponds to a write command, and a $14^{th}$ bit PCG corresponds to a precharge command. For example, during a normal write operation, $17^{th}$ to $14^{th}$ bits become "1010". During an auto-precharge write operation, $17^{th}$ to $14^{th}$ bits become "1011". $13^{th}$ to $10^{th}$ bits UDM are used as an upper-byte write data mask signal of write data applied over four clocks, $9^{th}$ to $6^{th}$ bits BANK mean bank information written during the write operation, and the $5^{th}$ to $0^{th}$ bits COLUMN ADDRESS mean a column address.

Referring to FIG. 3B, the write data frame is 16-bit write data applied over four clocks after the write command frame shown in FIG. 3A are inputted. Herein, $18^{th}$ and $9^{th}$ bits PHY correspond to a physical link coding bit, a $17^{th}$ bit CMD corresponds to a command bit, a $16^{th}$ bit LDM is an lower-byte write data mask signal of write data, and each of $15^{th}$ to $8^{th}$ bits UPPER BYTE and $7^{th}$ to $0^{th}$ bits LOWER BYTE means an upper byte and a lower byte of the write data, respectively. Herein, during the normal operation, the $17^{th}$ bit CMD becomes a logic level "LOW".

FIG. 4A is a timing diagram showing a normal write operation, and FIG. 4B is a timing diagram showing a preemption burst write operation of the multi-port memory device illustrated in FIG. 2.

Referring to FIG. 4A, in case of the normal write operation, the $17^{th}$ bit CMD and the $16^{th}$ bit ACT of the write command frame shown in FIG. 3A are decoded to activate a write command ECASPWT in synchronization with an internal clock CLK. 16-bit write data "VALID D0", "VALID D1", "VALID D2", and "VALID D3" are consecutively applied over four clocks of the internal clock CLK at every clock. That is, after the write command ECASPWT is applied, a total of 64-bits of write data are applied over four clocks at every internal clock CLK 16-bits per clock. Herein, each of the 16-bit write data "VALID D0", "VALID D1", "VALID D2", and "VALID D3" corresponds to the $15^{th}$ to $8^{th}$ bits UPPER BYTE and the $7^{th}$ to $0^{th}$ bits LOWER BYTE of the write data frame as shown in FIG. 3B.

Referring to FIG. 4B, in case of the preemption burst write operation, the $17^{th}$ bit CMD and the $16^{th}$ bit ACT of the write command frame shown in FIG. 3A are decoded to activate a write command ECASPWT in synchronization with an internal clock CLK. In the preemption burst write operation, the 16-bit write data "VALID D0", "VALID D1", "VALID D2", and "VALID D3" are not consecutively applied, but a no operation command "NOP" or other commands except for the write command are applied between the 16-bit write data "VALID D0", "VALID D1", "VALID D2", and "VALID D3" at every internal clock CLK.

However, in this time, it is difficult to detect whether the write command is applied or not after the no operation command "NOP" or the other commands are applied. As a result, there are errors in the multi-port memory device to thereby deteriorate a reliability and stability of the multi-port memory device.

SUMMARY OF THE INVENTION

It is, therefore, an object of the present invention to provide a multi-port memory device for supporting a preemption burst write operation and an interrupt write operation as well as a normal write operation.

In accordance with an aspect of the present invention, there is provided a multi-port memory device having a plurality of ports performing a serial input/output (I/O) communication with external devices, and a plurality of banks performing a parallel I/O communication with the ports through a plurality of global I/O lines, the multi-port memory device including: a write clock generating unit for generating a write clock which is selectively toggled only while write data are applied; a write control unit for generating a write flag signal group and a write driver enable signal in response to the write clock and a write command; a data latch unit for outputting intermediate write data by storing burst write data under the control of the write flag signal group; and a write driver for receiving the intermediate write data output from the data latch unit to write final write data to a memory cell of a corresponding bank in response to the write driver enable signal and a data mask signal group.

In accordance with a further aspect of the present invention, there is provided a multi-port memory device having a bank controller for controlling a parallel I/O communication between a plurality of ports and a plurality of banks, the multi-port memory device including: a write control unit for generating a write flag signal group and a write driver enable signal in response to a write command and a write clock selectively toggled only while write data are applied; a receiver for generating a write data frame including burst write data and a burst write command by selectively receiving parallel data from the ports; a data latch unit for outputting intermediate write data by storing the burst write data under the control of the write flag signal group; a write data mask signal storage unit for receiving the burst write data and the burst write command to generate the data mask signal group in response to the write flag signal group; and a write driver for receiving the intermediate write data output from the data latch unit to write final write data to a memory cell of a corresponding bank in response to the write driver enable signal and the data mask signal group.

BRIEF DESCRIPTION OF THE DRAWINGS

The above and other objects and features of the present invention will become apparent from the following description of the preferred embodiments given in conjunction with the accompanying drawings, in which:

FIGS. 3A and 3B are frame formats showing a write command frame and a write data frame of the multi-port memory device illustrated in FIG. 2, respectively;

FIGS. 4A and 4B are timing diagrams showing a write operation of the multi-port memory device illustrated in FIG. 2;

DETAILED DESCRIPTION OF THE INVENTION

Hereinafter, a multi-port memory device with a serial input/output (I/O) interface in accordance with exemplary embodiments of the present invention will be described in detail with reference to the accompanying drawings.

Figure 1:
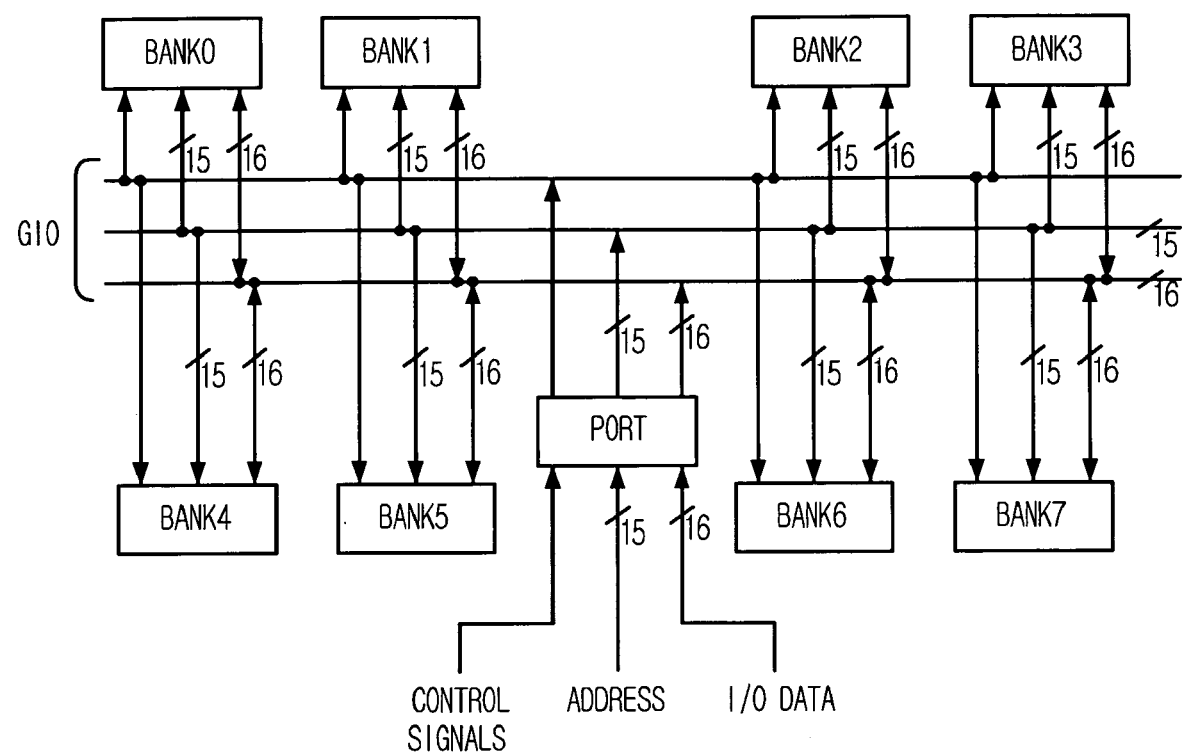
FIG. 1 is a block diagram of a conventional single-port memory device.
Figure 2:
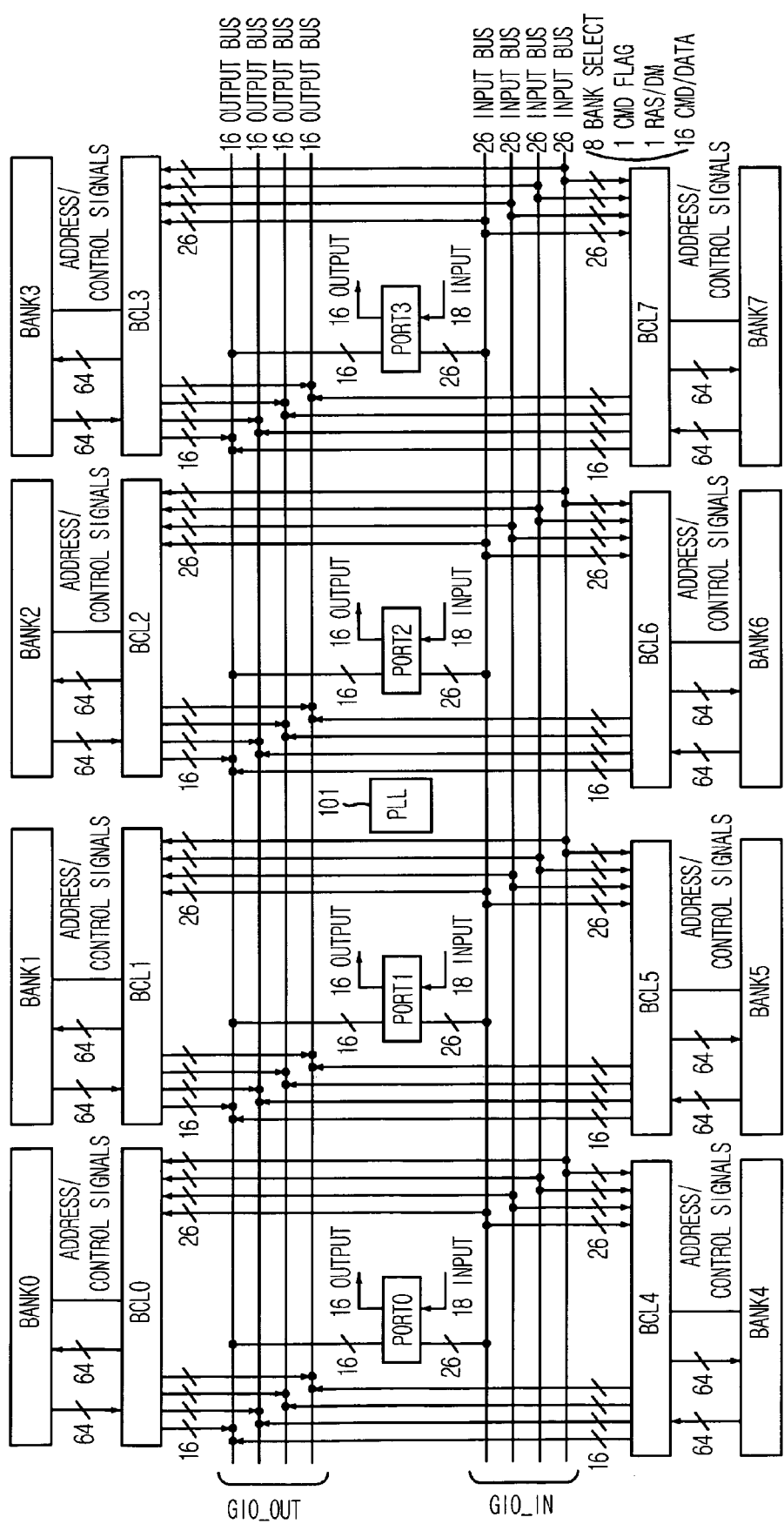
FIG. 2 is a block diagram of a multi-port memory device of the related arts.
Figure 5:
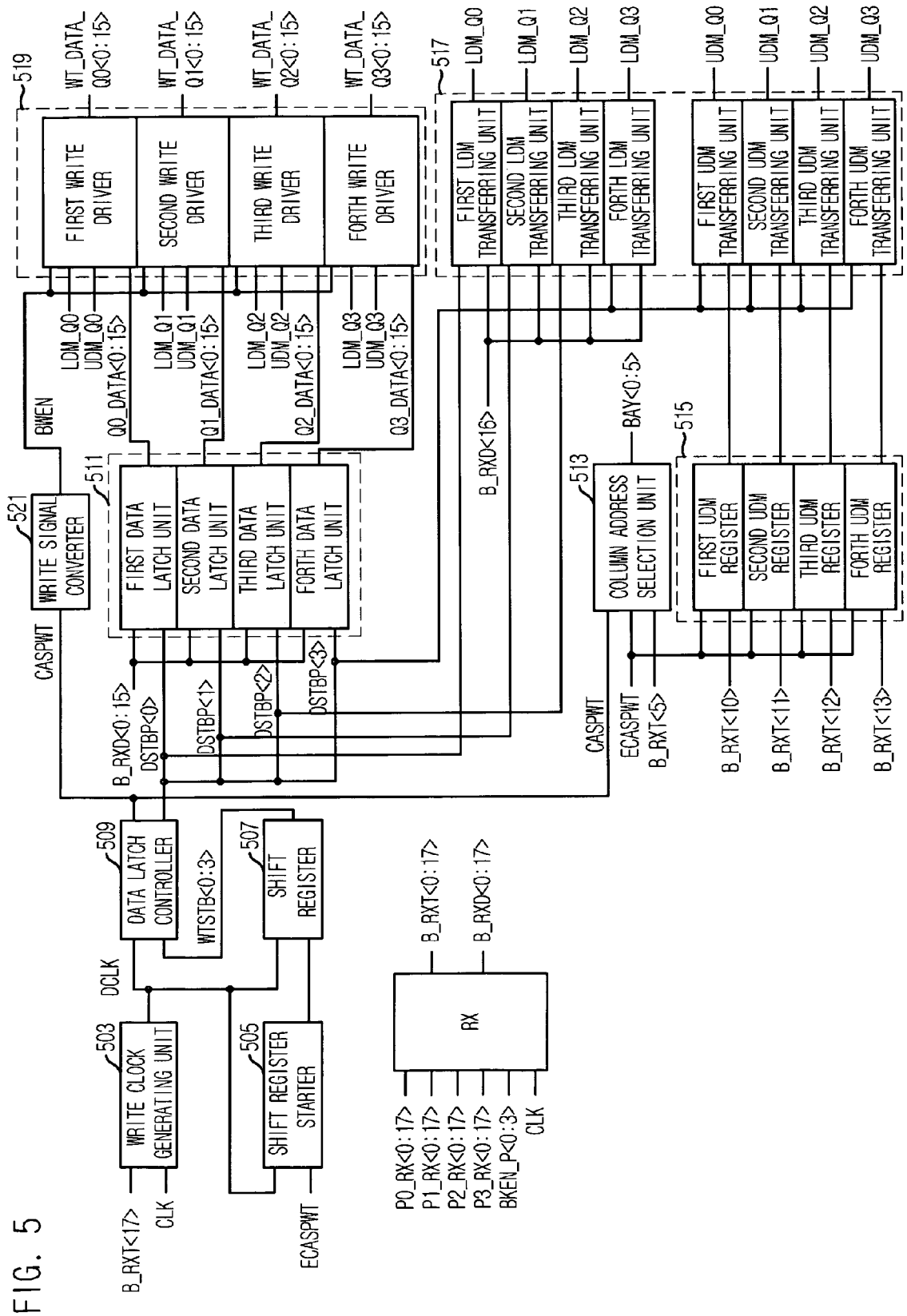
FIG. 5 is a block diagram of a bank controller provided in a multi-port memory device relating to a write operation path in accordance with an embodiment of the present invention.

FIG. 5 is a block diagram of a bank controller provided in a multi-port memory device relating to a write operation path in accordance with an embodiment of the present invention. Herein, the write operation path corresponds to one of a plurality of banks. If the number of banks is eight, the multi-port memory device includes eight write operation paths.

The write operation path includes a receiver (RX) 501, a write clock generating unit 503, a write control unit 505, 507, 509, and 521, a data latch unit 511, a column address selection unit 513, a write data mask signal storage unit 515 and 517, and a write driver 519.

The RX 501 generates a burst write command B_RXT<0: 17> and a burst write data B_RXD<0:17> by selecting one of parallel data Pi_RX<0:17> in response to a bank selection signal group BKEN_P<0:3>, i being from 0 to 3 as an integer number corresponding to the port number. The write clock generating unit 503 generates a write clock DCLK which is toggled only when write data are applied. The write control unit 505, 507, 509, and 521 generates a write flag signal group DSTBP<0:3> and a write driver enable signal BWEN in response to the write clock DCLK and a write command ECASPWT. The data latch unit 511 outputs an intermediate write data group Q<0:3>DATA<0:15> by storing the burst write data B_RXD<0:15> under the control of the write flag signal group DSTBP<0:3>. The column address selection unit 513 generates a column address signal group BAY<0:5> operating a column selection transistor, i.e., a YI transistor, for connecting bit lines with segment I/O lines, by decoding the burst write command B_RXT<0:5> corresponding to 5$^{th}$ to 0$^{th}$ bits COLUMN ADDRESS of a write command frame. The write data mask signal storage unit 515 and 517 outputs lower data mask (LDM) signal group LDM_Q<0:3> by receiving a 16$^{th}$ bit B_RXD<16> of the burst write data B_RXD<0:17> based on the write flag signal group DSTBP<0:3>, and upper data mask (UDM) signal group UDM_Q<0:3> by receiving the burst write command B_RXT<10:13> corresponding to 10$^{th}$ to 13$^{th}$ bits UDM of the write command frame based on a fourth write flag signal group DSTBP<3>. The write driver 519 receives the intermediate write data group Q<0:3>DATA<0:15> stored in the data latch unit 511 to write a final write data group WT_DATA_Q<0:3><0:15> to a memory cell based on the write driver enable signal BWEN.

In detail, the write control unit 505, 507, 509, and 521 includes a shift register starter 505, a shift register 507, a data latch controller 509, and a write signal converter 521. The shift register starter 505 starts the shift register 507. The shift register 507 outputs a write strobe signal group WTSTB<0: 3> by aligning an output signal of the shift register starter 505 to a falling edge of the write clock DCLK. The data latch controller 509 generates a final write signal CASPWT and the write flag signal group DSTBP<0:3> by dividing the write strobe signal group WTSTB<0:3>. The write signal converter 521 generates the write driver enable signal BWEN by adjusting and delaying a bandwidth of the final write signal CASPWT which is outputted in synchronization with the fourth write flag signal DSTBP<3>.

Further, the write data mask signal storage unit 515 and 517 includes a UDM registering unit 515 and a data mask transferring unit 517. The UDM registering unit 515 outputs an intermediate UDM signal group based on the burst write command B_RXT<10:13> corresponding to the 10$^{th}$ to 13$^{th}$ bits UDM of the write command frame. The data mask transferring unit 517 transfers the LDM signal group LDM_Q<0: 3> to the write driver 519 by receiving the 16$^{th}$ bit of burst write data B_RXD<16> in response to the write flag signal group DSTBP<0:3>, and the UDM signal group UDM_Q<0: 3> to the write driver 519 by receiving the intermediate UDM signal group in response to the fourth write flag signal DSTBP<3>.

Figure 6:
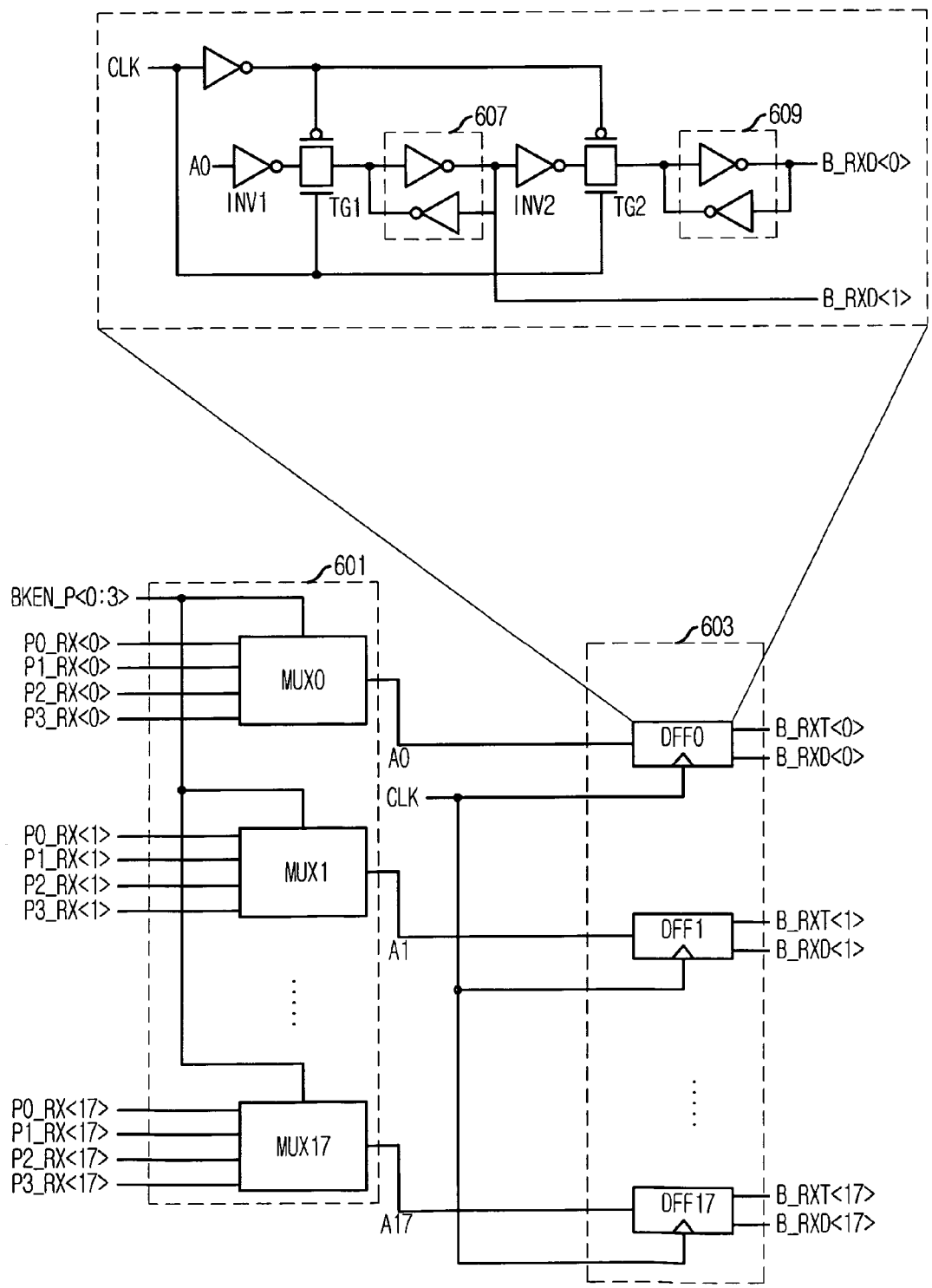
FIG. 6 is a circuit diagram of a receiver shown in FIG. 5.

FIG. 6 is a circuit diagram of the receiver (RX) 501 shown in FIG. 5.

The RX 501 includes a multiplexing unit 601 and a flip-flop unit 603, thereby selecting one of the parallel data Pi_RX<0: 17> in response to the bank selection signal group BKEN_P<0:3> to generate the burst write command B_RXT<0:17> and the burst write data B_RXD<0:17>.

The multiplexing unit 601 includes a plurality of multiplexers MUX0 to MUX17, each for receiving a corresponding bit of the 18-bit parallel data Pi_RX<0:17> input from each of the ports PORT0 to PORT3 in response to the bank selection signal group BKEN_P<0:3>. The flip-flop unit 603 includes a plurality of D-flip-flops DFF0 to DFF17, each for latching an output signal of a corresponding one of the multiplexers MUX0 to MUX17 in response to the internal clock CLK. Herein, each of the numbers of the multiplexers MUX0 to MUX17 and the D-flip-flops DFF0 to DFF17 corresponds to the number of the parallel data Pi_RX<0:17>, i.e., 18 bits.

For example, a first bit Pi_RX<0> of the 18-bit parallel data Pi_RX<0:17> is inputted to a first multiplexer MUX0, and an output signal of the first multiplexer MUX0 is inputted to a first D-flip-flop DFF0.

If a first bank selection signal BKEN_P<0> is a logic high level, the parallel data P0_RX<0:17> input from the first port PORT0 are inputted to the multiplexing unit 601. Then, the parallel data P0_RX<0:17> are synchronized with the internal clock CLK via the flip-flop unit 603.

Meanwhile, the RX 501 outputs the burst write command B_RXT<0:17> and the burst write data B_RXD<0:17> by arranging them fit for a write command frame or a write data frame. Accordingly, the burst write command B_RXT<0:17> and the burst write data B_RXD<0:17> become one of the write command frame and the write data frame.

Each of the D-flip-flops DFF0 to DFF17 has the same circuit structure, and thus, the first D-flip-flop DFF0 will be described as an exemplary structure.

The first D-flip-flop DFF0 includes first and second inverters INV1 and INV2, first and second transfer gates TG1 and TG2, and first and second latches 607 and 609.

The first inverter INV1 inverts each output of the first multiplexer MUX0, i.e., A0. The first transfer gate TG1 selectively outputs an output of the first inverter INV1 in response to the internal clock CLK. The first latch 607 latches an output of the first transfer gate TG1 to output a first bit B_RXT<0> of the burst write command B_RXT<0:17> as the write command frame. The second inverter INV2 inverts an output of the first latch 607. The second transfer gate TG2 selectively outputs an output of the second inverter INV2 in response to the internal clock CLK. The second latch 609 latches an output of the second transfer gate TG2 to output a first bit B_RXD<0> of the burst write data B_RXD<0:17> as the write data frame. Herein, the first and second latches may be implemented with an even number of inverters.

As described above, the burst write command B_RXT<0:17> is generated prior to the burst write data B_RXD<0:17>. Accordingly, the burst write command B_RXT<0:17> generates the write command ECASPWT when $17^{th}$ to $14^{th}$ bits of the burst write command B_RXT<0:17> become "1010" or "1011".

Figure 7:
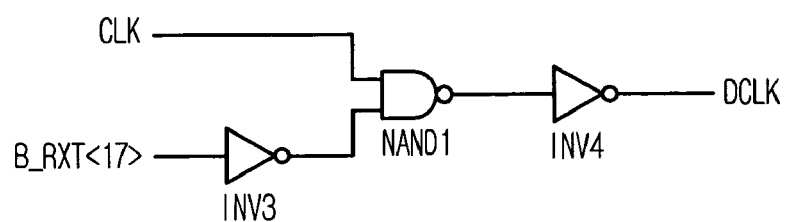
FIG. 7 is a circuit diagram of a write clock generating unit shown in FIG. 5.

FIG. 7 is a circuit diagram of the write clock generating unit 503 shown in FIG. 5.

The write clock generating unit 503 includes first and second inverters INV3 and INV4, and a NAND gate NAND1. The first inverter INV3 inverts a $17^{th}$ bit B_RXT<17> of the burst write command B_RXT<0:17> corresponding to a $17^{th}$ bit CMD of the write command frame. The NAND gate NAND1 performs a NAND operation of the internal clock CLK and an output of the first inverter INV3. The second inverter INV4 inverts an output of the NAND gate NAND1 to output the write clock DCLK.

If the write data are applied, the $17^{th}$ bit CMD of the write command is a logic low level, and if a no operation command "NOP" or other commands except for the write command are applied, the $17^{th}$ bit CMD of the write command is a logic high level. Accordingly, the write clock generating unit 503 generates the write clock DCLK which operates only when the write data are applied.

Figure 8:
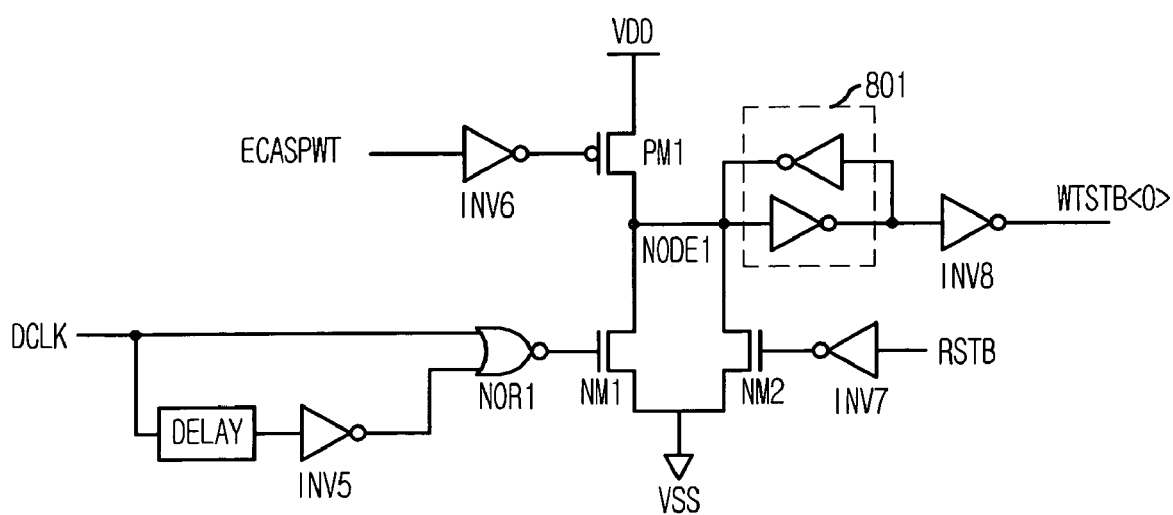
FIG. 8 is a circuit diagram of a shift register starter shown in FIG. 5.

FIG. 8 is a circuit diagram of the shift register starter 505 shown in FIG. 5.

The shift register starter 505 includes first to fourth inverters INV5 to INV8, NMOS transistors NM1 and NM2, a PMOS transistor PM1, a NOR gate NOR1, a latch 801, and a delay unit DELAY.

The delay unit DELAY delays the write clock DCLK. The first inverter INV5 inverts an output of the delay unit DELAY. The NOR gate NOR1 performs a NOR operation of the write clock DCLK and an output of the first inverter INV5. The first NMOS transistor NM1 connected between a first node NODE1 and a ground voltage (VSS) terminal has a gate for receiving an output of the NOR gate NOR1. The second inverter INV6 inverts the write command ECASPWT. The PMOS transistor PM1 connected between a power supply voltage (VDD) terminal and the first node NODE1 has a gate for receiving an output of the second inverter INV6. The third inverter INV7 inverters an inverted reset signal RSTB for resetting the latch unit 801. The second NMOS transistor NM2 connected between the VSS terminal and the first node NODE1 has a gate for receiving an output of the third inverter INV7. The latch 801 latches a signal at the first node NODE1. The fourth inverter INV8 inverts an output of the latch 801 to output a first write strobe signal WTSTB<0> of the write strobe signal group WTSTB<0:3>. Herein, the latch 801 may be implemented with an even-number of inverters.

As described above, the shift register starter 505 activates the first write strobe signal WTSTB<0> when the write command ECASPWT is a logic high level and the write clock DCLK is a logic low level. The first write strobe signal WTSTB<0> output from the shift register starter 505 is inputted to the shift register 507 so as to be aligned with the write clock DCLK.

Figure 9:
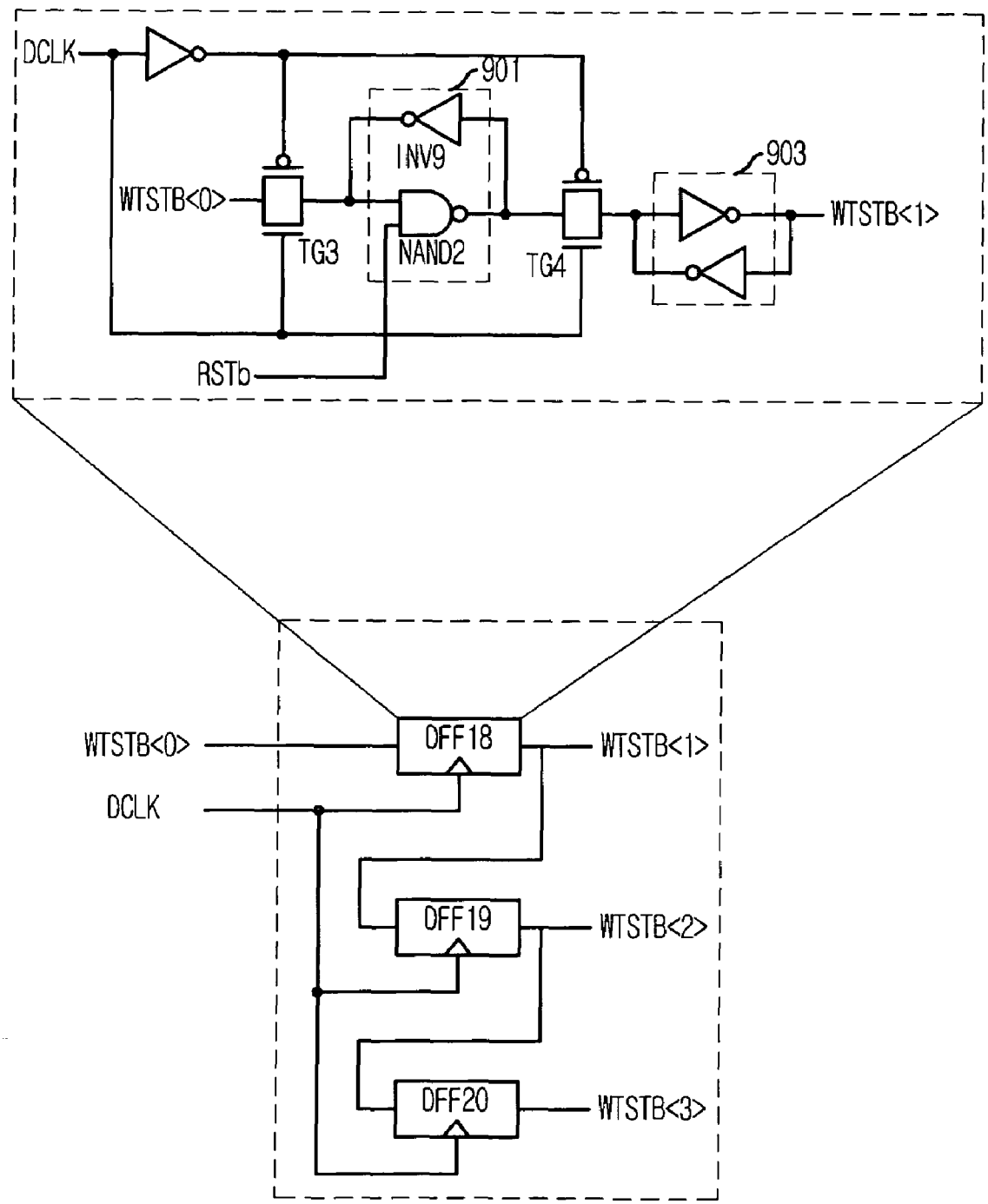
FIG. 9 is a circuit diagram of a shift register shown in FIG. 5.

FIG. 9 is a circuit diagram of the shift register 507 shown in FIG. 5.

The shift register 507 includes first to third flip-flops DFF18 to DFF20 to generate the second to fourth write strobe signals WTSTB<1:3> by aligning the first write strobe signal WTSTB<0> with the write clock DCLK.

The first flip-flop DFF18 outputs a second write strobe signal WTSTB<1> by aligning the first write strobe signal WTSTB<0> with the write clock DCLK. The second flip-flop DFF19 outputs a third write strobe signal WTSTB<2> by aligning the second write strobe signal WTSTB<1> with the write clock DCLK. The third flip-flop DFF20 outputs a fourth write strobe signal WTSTB<3> by aligning the third write strobe signal WTSTB<2> with the write clock DCLK.

Each of the first to third flip-flops DFF18 to DFF20 has the same circuit structure, and thus, the first D-flip-flop DFF18 will be described as an exemplary structure.

The first D-flip-flop DFF18 includes first and second transfer gates TG3 and TG4, and first and second latches 901 and 903.

The first transfer gate TG3 selectively outputs the first write strobe signal WTSTB<0> in response to the write clock DCLK. The first latch 901 reset by the inverted reset signal RSTB latches an output of the first transfer gate TG3. The second transfer gate TG4 selectively outputs an output of the first latch 901 in response to the write clock DCLK. The second latch 903 latches an output of the second transfer gate TG4 to output the second write strobe signal WTSTB<1>.

The first latch 901 includes a NAND gate NAND2 and an inverter INV9. The NAND gate NAND2 performs a NAND gate of the inverted reset signal RSTB and the output of the first transfer gate TG3. The inverter INV9 inverts an output of the NAND gate NAND2 to output the inverted signal to the NAND gate NAND2. The second latch 903 may be implemented with an even-number of inverters.

As described above, the shift register 507 receives the first write strobe signal WTSTB<0> and outputs the second to fourth write strobe signals WTSTB<1:3>. Herein, the first write strobe signal WTSTB<0> is enabled in synchronization with a falling edge of the write command ECASPWT and disabled in synchronization with a falling edge of the write clock DCLK. Accordingly, the second write strobe signal WTSTB<1> is enabled during one period of the write clock DCLK in response to a falling edge of the first write strobe signal WTSTB<0>; the third write strobe signal WTSTB<2> is enabled during one period of the write clock DCLK in response to a falling edge of the second write strobe signal WTSTB<1>; and the fourth write strobe signal WTSTB<3> is enabled during one period of the write clock DCLK in response to a falling edge of the third write strobe signal WTSTB<2>.

The write strobe signal group WTSTB<0:3> output from the shift register 507 is inputted to the data latch controller 509 with the write clock DCLK.

Figure 10:
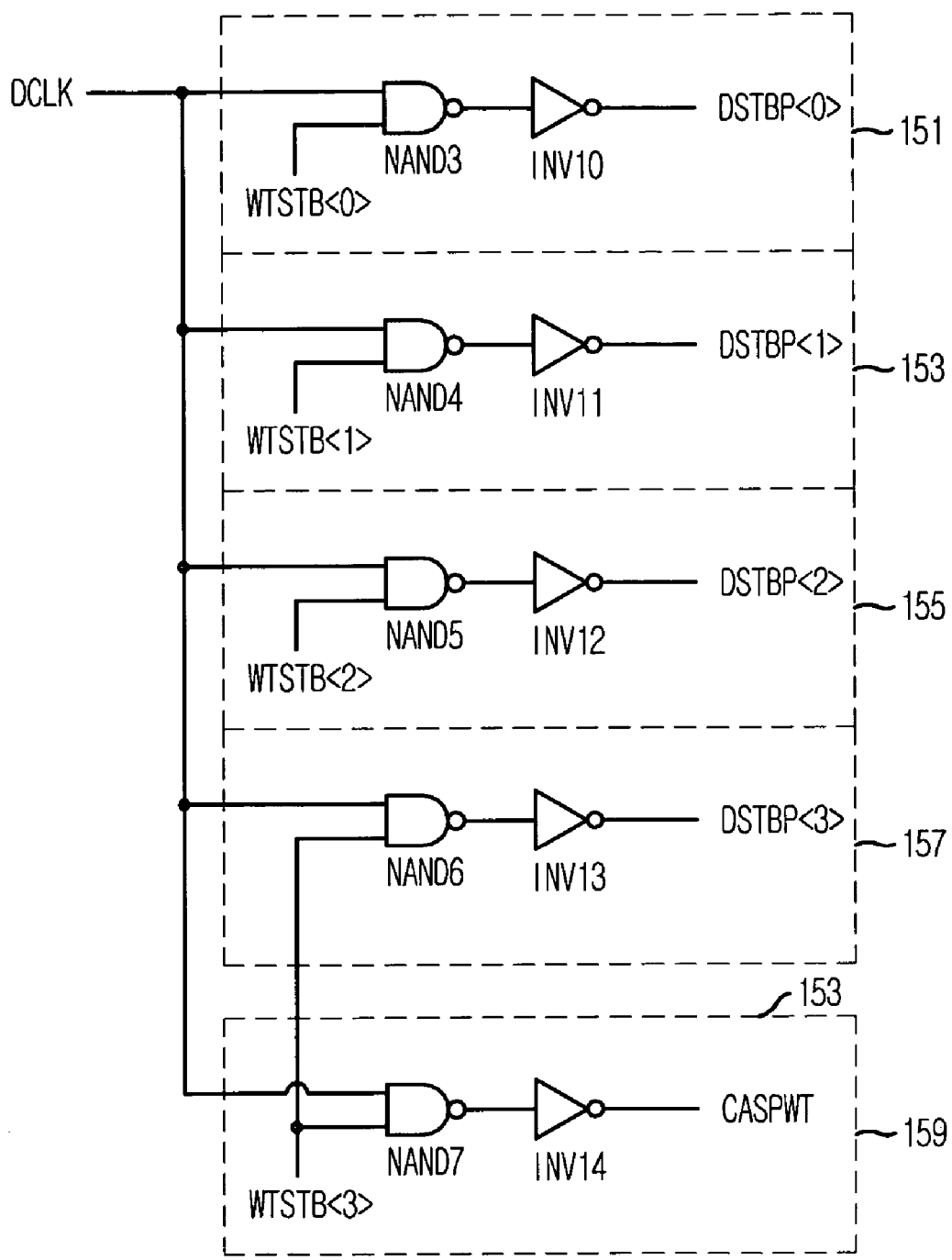
FIG. 10 is a circuit diagram of a data latch controller shown in FIG. 5.

FIG. 10 is a circuit diagram of the data latch controller 509 shown in FIG. 5.

The data latch controller 509 includes first to fourth write flag signal generators 151 to 157, and a write signal generator 159. The first to fourth write flag signal generators 151 to 157 generate the write flag signal group DSTBP<0:3> used as a control signal of the data latch unit 511. The write signal generator 159 generates the final write signal CASPWT.

The first write flag signal generator 151 includes a first NAND gate NAND3 for performing a NAND operation of the write clock DCLK and the first write strobe signal WTSTB<0>, and a first inverter INV10 for inverting an output of the first NAND gate NAND3 to output a first write flag signal DSTBP<0>. The second write flag signal generator 153 includes a second NAND gate NAND4 for performing a NAND operation of the write clock DCLK and the second write strobe signal WTSTB<1>, and a second inverter INV11 for inverting an output of the second NAND gate NAND4 to output a second write flag signal DSTBP<1>. The third write flag signal generator 155 includes a third NAND gate NAND5 for performing a NAND operation of the write clock DCLK and the third write strobe signal WTSTB<2>, and a third inverter INV12 for inverting an output of the third NAND gate NAND5 to output a third write flag signal DSTBP<2>. The fourth write flag signal generator 157 includes a fourth NAND gate NAND6 for performing a NAND operation of the write clock DCLK and the fourth write strobe signal WTSTB<3>, and a fourth inverter INV13 for inverting an output of the fourth NAND gate NAND6 to output the fourth write flag signal DSTBP<3>.

The write signal generator 159 includes a fifth NAND gate NAND7 performing a NAND operation of the write clock DCLK and the fourth write strobe signal WTSTB<3>, and a fifth inverter INV14 inverting an output of the fifth NAND gate NAND7 to output the final write signal CASPWT.

As described above, the write flag signal group DSTBP<0:3> is generated by performing an AND operation of the write clock DCLK and the write strobe signal group WTSTB<0:3> to thereby be sequentially enabled in response to rising edges of the write clock DCLK and sequentially disabled in response to falling edges of the write strobe signal group WTSTB<0:3>.

The write flag signal group DSTBP<0:3> output from the data latch controller 509 is inputted to the data latch unit 511.

Figure 11:
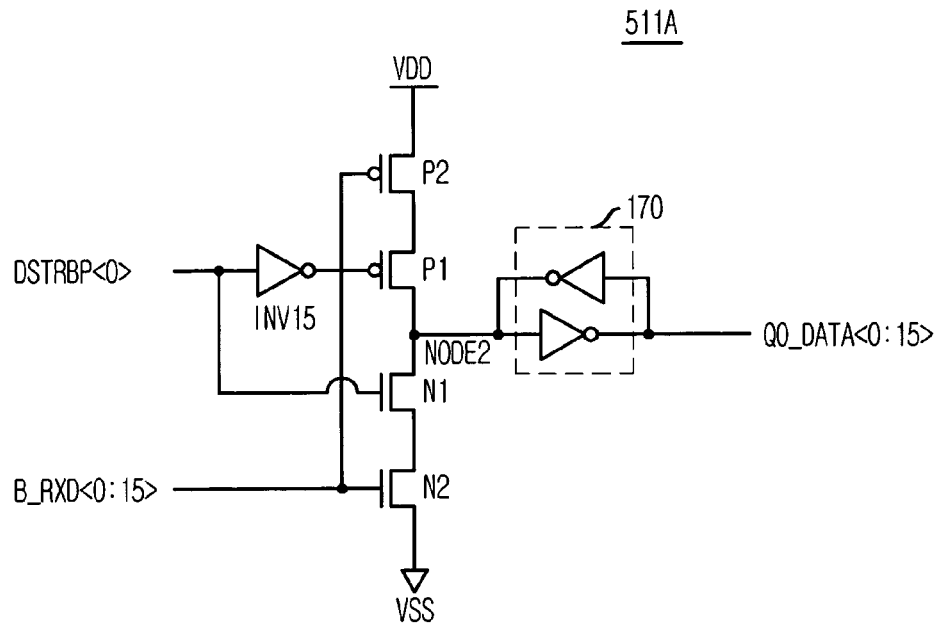
FIG. 11 is a circuit diagram of a first data latch unit shown in FIG. 5.

FIG. 11 is a circuit diagram of a first data latch unit 511A of the data latch unit 511 shown in FIG. 5.

The data latch unit 511 includes first to fourth data latch units. The first data latch unit 511A receives substantial write data of the burst write data B_RXD<0:17> in response to the first write flag signal DSTBP<0> to output first intermediate write data Q0_DATA<0:15>. Herein, the substantial write data includes an upper byte corresponding to the $15^{th}$ to $8^{th}$ bits B_RXD<8:15> of the burst write data B_RXD<0:17>, and a lower byte corresponding to the $7^{th}$ to $0^{th}$ B_RXD<0:7> bits of the burst write data B_RXD<0:17>. Likewise, the second data latch unit receives substantial write data of the burst write data B_RXD<0:17> in response to the second write flag signal DSTBP<1> to output second intermediate write data Q1_DATA<0:15>. The third data latch unit receives substantial write data of the burst write data B_RXD<0:17> in response to the third write flag signal DSTBP<2> to output third intermediate write data Q2_DATA<0:15>. The fourth data latch unit receives substantial write data of the burst write data B_RXD<0:17> in response to the fourth write flag signal DSTBP<3> to output fourth intermediate write data Q3_DATA<0:15>.

Each of the second to fourth data latch units has the same circuit structure as that of the first data latch unit 511A, and thus, the first data latch unit 511A will be described as an exemplary structure.

The first data latch unit 511A includes an inverter INV15, first and second PMOS transistors P1 and P2, first and second NMOS transistors N1 and N2, and a latch 170. The inverter INV15 inverts the first write flag signal DSTBP<0>. The first PMOS transistor P1 connected to a second node NODE2 includes a gate for receiving an output of the inverter INV15. The first NMOS transistor N1 connected to the second node NODE2 includes a gate for receiving the write flag signal DSTBP<0>. The second PMOS transistor P2 connected between the VDD terminal and the first PMOS transistor P1 includes a gate for receiving the substantial write data, i.e., B_RXD<0:15>. The second NMOS transistor N2 connected between the VSS terminal and the first NMOS transistor N1 has a gate for receiving the substantial write data of the burst write data B_RXD<0:17>, i.e., B_RXD<0:15>. The latch 170 latches a signal at the second node NODE2 to output the first intermediate write data Q0_DATA<0:15>.

As described above, the data latch unit 511 sequentially stores the 16-bit write data under the control of the write flag signal group DSTBP<0:3>. Accordingly, a total of 64-bits of write data are stored after the fourth write flag signal DSTBP<3> is inputted. Further, the final write signal CASPWT is simultaneously generated with the fourth write flag signal DSTBP<3> and is transferred to the write driver 519 via the write signal converter 521.

Figure 12:
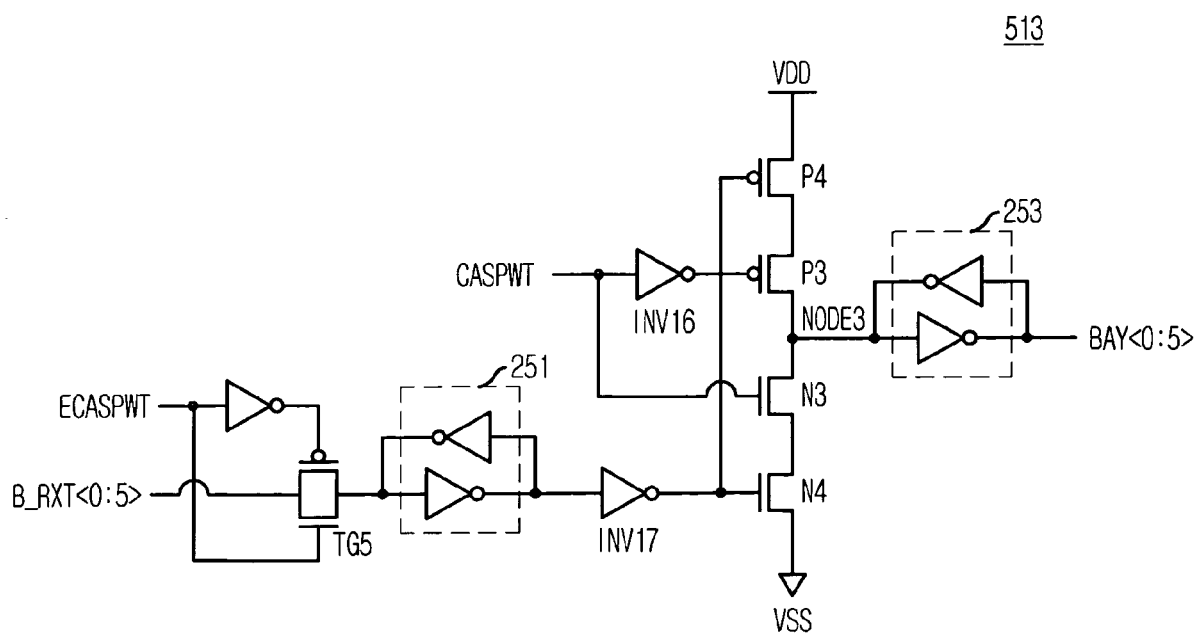
FIG. 12 is a circuit diagram of a column address selection unit shown in FIG. 5.

FIG. 12 is a circuit diagram of the column address selection unit 513 shown in FIG. 5.

The column address selection unit 513 includes a transfer gate TG5, first and second latches 251 and 253, first and second inverters INV16 and INV17, first and second NMOS transistors N3 and N4, and first and second PMOS transistors P3 and P4.

The first inverter INV16 inverts the final write signal CASPWT. The first PMOS transistor P3 connected to a third node NODE3 has a gate for receiving an output of the first inverter INV16. The first NMOS transistor N3 connected to the third node NODE3 has a gate for receiving the final write signal CASPWT. The transfer gate TG5 selectively outputs $5^{th}$ to $0^{th}$ bit B_RXT<0:5> of the burst write command B_RXT<0:17>, corresponding to $5^{th}$ to $0^{th}$ bits COLUMN ADDRESS of the write command frame, in response to the write command ECASPWT. The first latch 251 latches an output of the transfer gate TG5. The second inverter INV17 inverts an output of the first latch 251. The second PMOS transistor P4 connected between the VDD terminal and the first PMOS transistor P3 has a gate for receiving an output of the second inverter INV17. The second NMOS transistor N4 connected between the VSS terminal and the first NMOS transistor N3 has a gate for receiving the output of the second inverter INV17. The second latch 253 latches a signal at the third node NODE3 to output the column address signal group BAY<0:5> for operating a column selection transistor, i.e., a YI transistor, for connecting bit lines with segment I/O lines.

As described above, the column address selection unit 513 generates the column address signal group BAY<0:5> by decoding the burst write command B_RXT<0:5> corresponding to the $5^{th}$ to $0^{th}$ bits COLUMN ADDRESS of the write command frame, thereby transferring the write data to a corresponding one of the bit lines.

Figure 13:
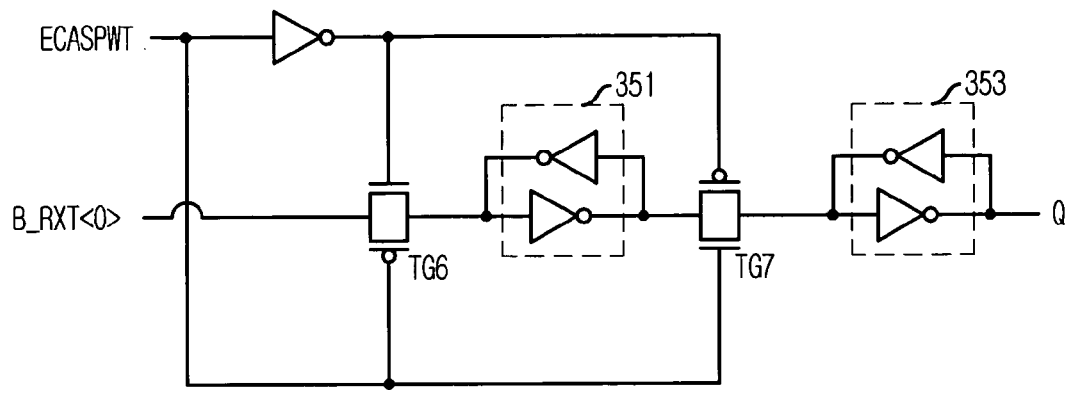
FIG. 13 is a circuit diagram of a first upper data mask (UDM) register shown in FIG. 5.

FIG. 13 is a circuit diagram of a first upper data mask (UDM) register 515A of the UDM registering unit 515 shown in FIG. 5.

The upper data mask (UDM) registering unit 515 includes first to fourth UDM registers. The first UDM register 515A stores a $10^{th}$ bit B_RXT<10> of the burst write command B_RXT<0:17>, i.e., a $1^{st}$ UDM bit of the write command frame, in response to the write command ECASPWT. The second UDM register stores an $11^{th}$ bit B_RXT<11>, i.e., a $2^{nd}$ UDM bit of the write command frame, in response to the write command ECASPWT. The third UDM register stores a $12^{th}$ bit B_RXT<12>, i.e., a $3^{th}$ UDM bit of the write command frame, in response to the write command ECASPWT. The fourth UDM register stores a $13^{th}$ bit B_RXT<13>, i.e., a $4^{th}$ UDM bit of the write command frame, in response to the write command ECASPWT.

Each of the second to fourth UDM registers has the same circuit structure as that of the first UDM register 515A, and thus, the first UDM register 515A will be described as an exemplary structure.

The first UDM register 515A includes first and second transfer gates TG6 and TG7, and first and second latches 351 and 353. The first transfer gate TG6 selectively outputs the $10^{th}$ bit B_RXT<10> of the burst write command B_RXT<0:17> in response to an inverted write command ECASPWT. The first latch 351 latches an output of the first transfer gate TG6. The second transfer gate TG7 selectively outputs an output of the first latch 351 in response to the write command ECASPWT. The second latch 353 latches an output of the second transfer gate TG7.

As described above, the UDM registering unit 515 stores the burst write command B_RXT<10:13> corresponding to the $10^{th}$ to $13^{th}$ bits UDM of the write command frame, thereby outputting the intermediate UDM signal group to the data mask transferring unit 517. Herein, the $10^{th}$ to $13^{th}$ bits UDM of the write command frame determines whether the upper byte of the write data is written or not.

Figure 14:
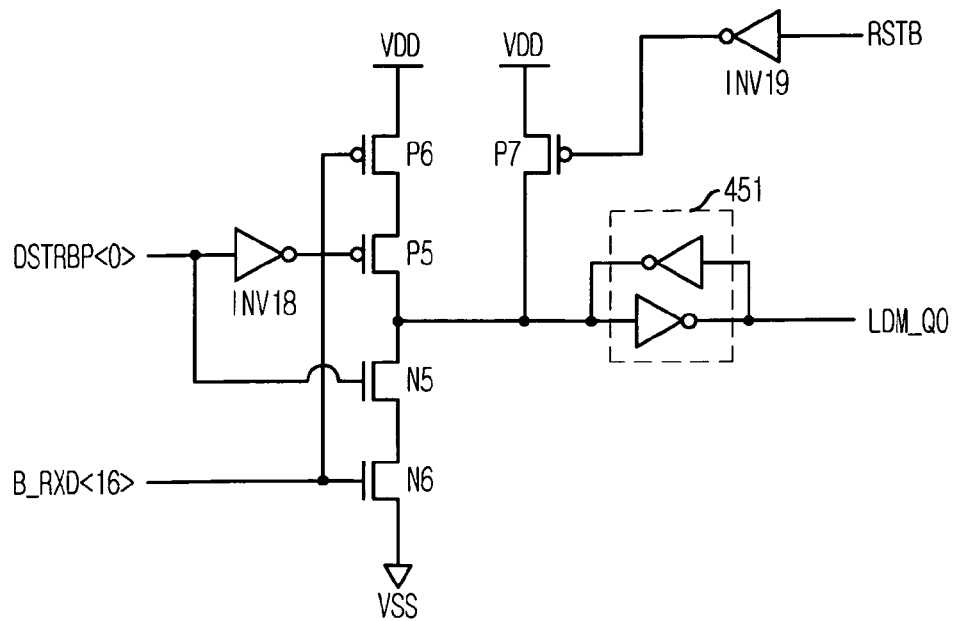
FIG. 14 is a circuit diagram of a first lower data mask (LDM) transferring unit shown in FIG. 5.

FIG. 14 is a circuit diagram of a first lower data mask (LDM) transferring unit 517A of the data mask transferring unit 517 shown in FIG. 5.

The data mask transferring unit 517 includes a lower data mask (LDM) transferring unit and an upper data mask (UDM) transferring unit. The LDM transferring unit transfers the $16^{th}$ bit B_RXT<16> of the burst write command B_RXT<0:17> to the write driver 519 in response to the write flag signal group DSTBP<0:3>. The UDM transferring unit transfers the intermediate UDM signal group to the write driver 519 in response to the fourth write flag signal group DSTBP<3> of the write flag signal group DSTBP<0:3>.

The LDM transferring unit includes first to fourth LDM units. The first LDM unit 517A transfers the $16^{th}$ bit B_RXD<16> of the burst write data B_RXD<0:17> to the write driver 519 in response to the first write flag signal DSTBP<0>. The second LDM unit transfers the $16^{th}$ bit B_RXD<16> to the write driver 519 in response to the second write flag signal DSTBP<1>. The third LDM unit transfers the $16^{th}$ bit B_RXD<16> to the write driver 519 in response to the third write flag signal DSTBP<2>. The fourth LDM unit transfers the $16^{th}$ bit B_RXD<16> to the write driver 519 in response to the fourth write flag signal DSTBP<3>.

The UDM transferring unit includes first to fourth UDM units. The first UDM unit transfers a first intermediate UDM signal of the intermediate UDM signal group to the write driver 519 in response to the fourth write flag signal DSTBP<3>. The second UDM unit transfers a second intermediate UDM signal to the write driver 519 in response to the fourth write flag signal DSTBP<3>. The third UDM unit transfers a third intermediate UDM signal to the write driver 519 in response to the fourth write flag signal DSTBP<3>. The fourth UDM unit transfers a fourth intermediate UDM signal to the write driver 519 in response to the fourth write flag signal DSTBP<3>.

Each of the second to fourth UDM units has the same circuit structure as that of the first LDM unit 517A, and thus, the first LDM unit 517A will be described as an exemplary structure.

The first LDM unit 517A includes first and second inverters INV18 and INV19, first to third PMOS transistors P5 to P7, first and second NMOS transistors N5 and N6, and a latch 451.

The first inverter INV18 inverts the first write flag signal DSTBP<0>. The first PMOS transistor P5 connected to a fourth node NODE4 has a gate for receiving an output of the first inverter INV18. The first NMOS transistor N5 connected to the fourth node NODE4 has a gate for receiving the first write flag signal DSTBP<0>. The second PMOS transistor P6 connected between the VDD terminal and the first PMOS transistor P5 has a gate for receiving the $16^{th}$ bit B_RXD<16> of the burst write data B_RXD<0:17>. The second NMOS transistor N6 connected between the VSS terminal and the first NMOS transistor N5 has a gate for receiving the $16^{th}$ bit B_RXD<16>. The second inverter INV19 inverts the inverted reset signal RSTB. The third PMOS transistor P7 connected between the fourth node NODE4 and the VDD terminal has a gate for receiving an output of the second inverter INV19. The latch 451 latches a signal at the fourth node NODE4 to output a first LDM signal LDM_Q<0>.

As described above, the data mask transferring unit 517 transfers a corresponding one of the LDM signal group LDM_Q<0:3> and the UDM signal group UDM_Q<0:3> to the write driver 519 in response to the write flag signal group DSTBP<0:3>.

Meanwhile, the write driver 519 is a driver to write the final write data group WT_DATA_Q<0:3><0:15> to the memory cell by receiving the intermediate write data group Q<0:3>DATA<0:15> output from the data latch unit 511.

The write driver 519 includes first to fourth write drivers corresponding to the first to fourth data latch units, thereby simultaneously writing the final write data group WT_DATA_Q<0:3><0:15> to the memory cell provided in the banks.

Figure 15:
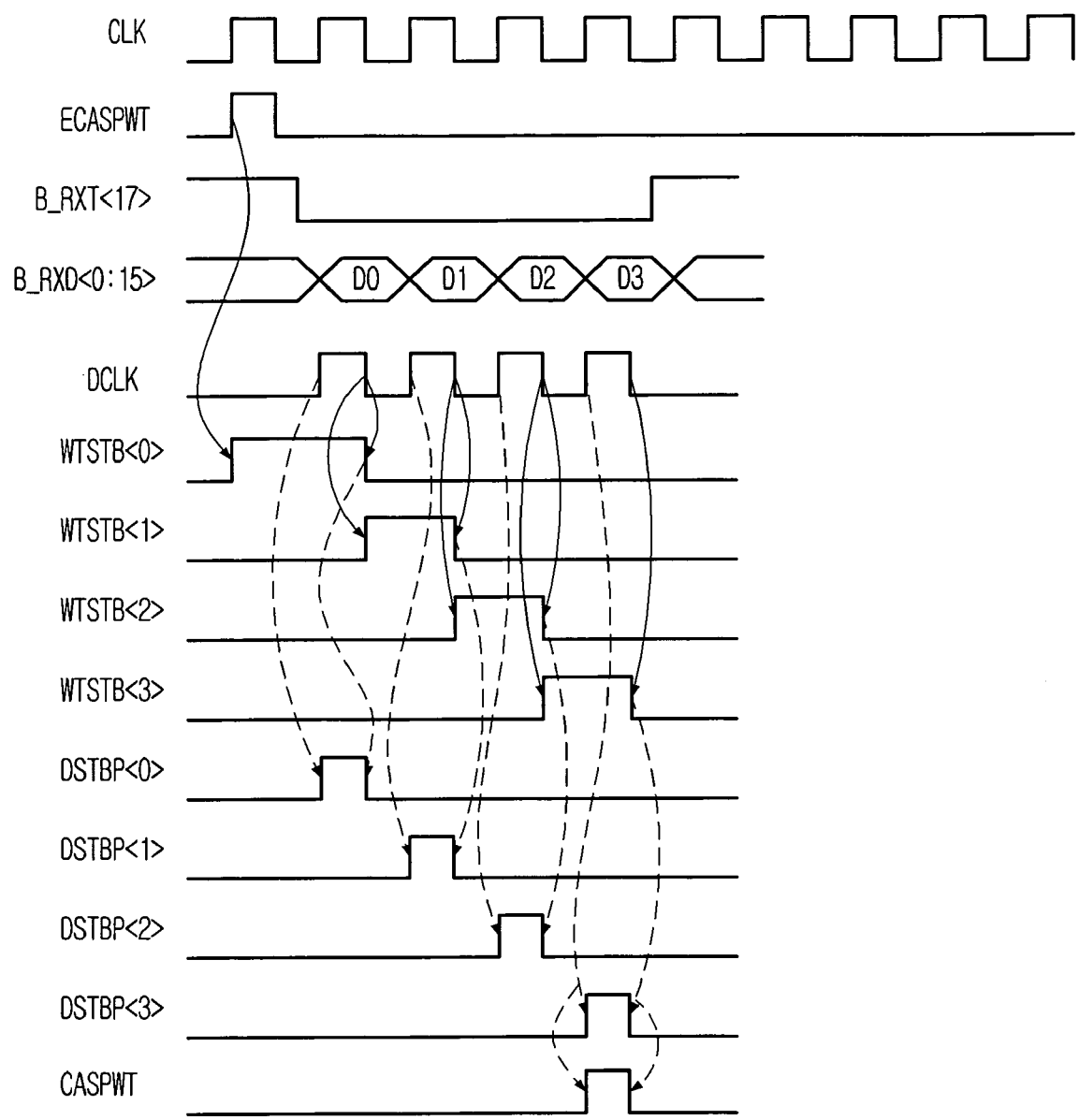
FIG. 15 is a timing diagram showing a normal write operation of the multi-port memory device illustrated in FIG. 5.

FIG. 15 is a timing diagram showing a normal write operation of the multi-port memory device illustrated in FIG. 5. Herein, $15^{th}$ to $0^{th}$ bits B_RXD<0:15> of the burst write data B_RXD<0:17> mean an upper byte and a lower byte of the write data.

In case of the normal write operation, the write clock DCLK is generated by using the internal clock CLK and the $17^{th}$ bit B_RXT<17> of the burst write command B_RXT<0:17> corresponding to the $17^{th}$ bit CMD of the write command frame. Herein, the $17^{th}$ bit B_RXT<17> of the burst write command B_RXT<0:17> maintains a logic low level when the write data are applied, and otherwise, maintains a logic high level. Accordingly, the write clock DCLK is toggled only when the write data are applied. The write clock DCLK has a 4-clock cycle because the write data are applied in a 16-bit basis during four clocks.

The first write strobe signal WTSTB<0> is enabled in synchronization with the falling edge of the write command ECASPWT and disabled in synchronization with the falling edge of the write clock DCLK. The second to fourth write strobe signals WTSTB<1:3> are enabled during one period of the write clock DCLK in response to the falling edge of the first to third write strobe signals WTSTB<0:2>, respectively.

The write flag signal group DSTBP<0:3> is enabled in synchronization with the rising edge of the write clock DCLK and disabled in synchronization with the falling edges of the write strobe signal group WTSTB<0:3>, respectively. Accordingly, the write data D<0:3> are latched based on the write flag signal group DSTBP<0:3>, respectively.

The final write signal CASPWT is simultaneously enabled with the fourth write flag signal DSTBP<3>, and the write driver enable signal BWEN is generated by adjusting and delaying the bandwidth of the final write signal CASPWT. The write driver enable signal BWEN is used as a control signal of the write driver 519 for writing the write data D<0:3> to the memory cell.

Accordingly, in case of the normal write operation, the write clock DCLK is toggled only when the write data D<0:3> are applied. As a result, the write data D<0:3> are sequentially applied to the memory cell in a 16-bit basis.

Figure 16:
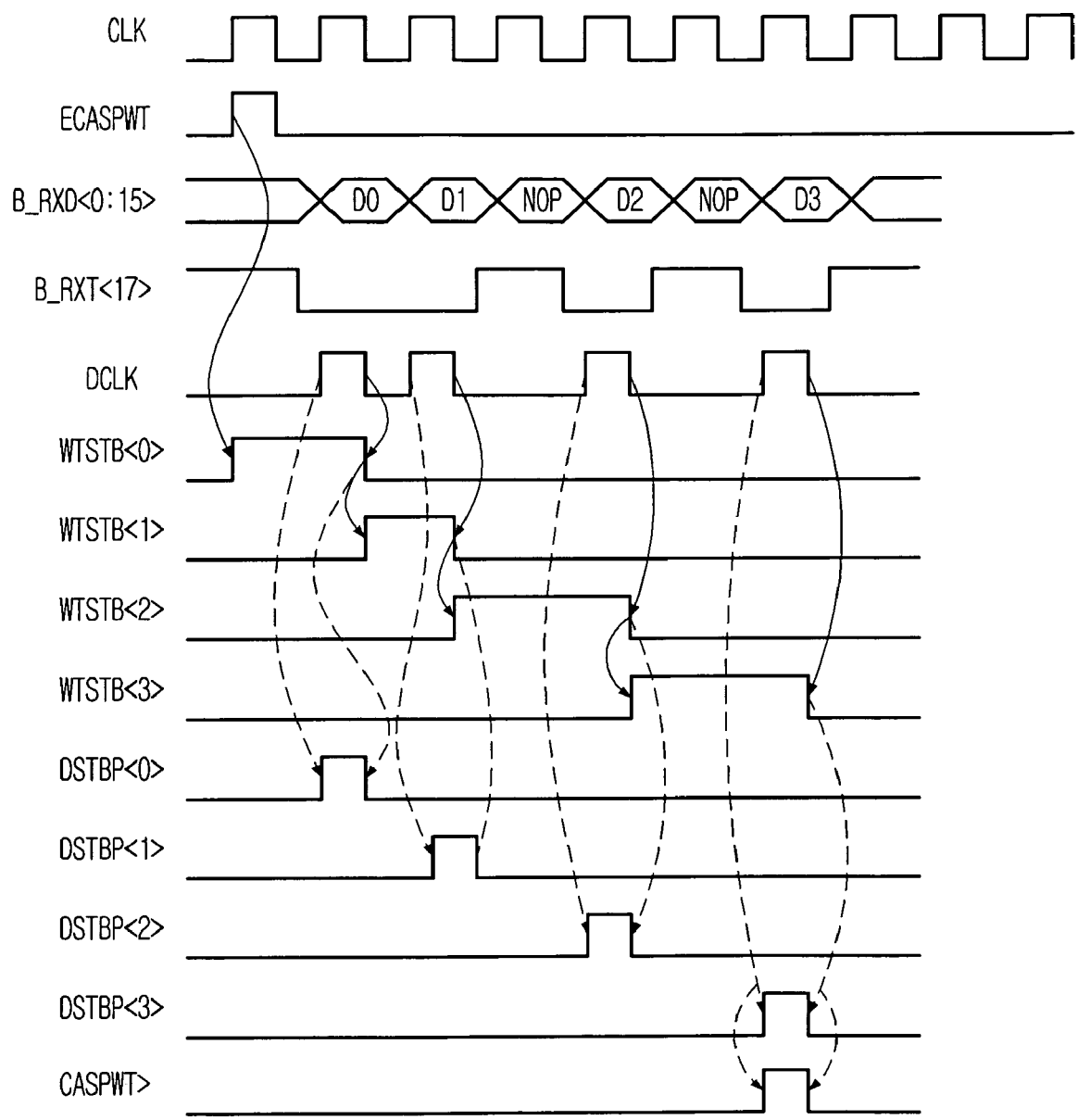
FIG. 16 is timing diagram showing a preemption burst write operation of the multi-port memory device illustrated in FIG. 5.

FIG. 16 is timing diagram showing a preemption burst write operation of the multi-port memory device illustrated in FIG. 5. Herein, the preemption burst write operation means that a no operation command "NOP" or other commands except for the write command are applied between the write data.

In case of the preemption burst write operation, the $17^{th}$ bit B_RXT<17> of the burst write command B_RXT<0:17> is a logic low level when the write data are applied; and, the $17^{th}$ bit B_RXT<17> maintains a logic high level during the no operation command "NOP" or other commands unless the write command is applied. That is, the write clock DCLK is generated only when the write data are applied.

The first write strobe signal WTSTB<0> is enabled in synchronization with the falling edge of the write command ECASPWT and disabled in synchronization with the falling edge of the write clock DCLK. The second to fourth write strobe signals WTSTB<1:3> are enabled during one period of the write clock DCLK in response to the falling edge of the first to third write strobe signals WTSTB<0:2>, respectively.

The write flag signal group DSTBP<0:3> is enabled in synchronization with the rising edge of the write clock DCLK and disabled in synchronization with the falling edge of the write strobe signal group WTSTB<0:3>, respectively. Accordingly, the write data D<0:3> are latched based on the write flag signal group DSTBP<0:3>, respectively.

The final write signal CASPWT is simultaneously enabled with the fourth write flag signal DSTBP<3>, and the write driver enable signal BWEN is generated by adjusting and delaying the bandwidth of the final write signal CASPWT.

Accordingly, in case of the preemption burst write operation, the write clock DCLK is toggled when the write data are applied, and is not toggled during the no operation command "NOP" or other commands unless the write command is applied. As a result, it is possible to sequentially write the write data D<0:3> to the memory cell in a 16-bit basis.

As described above, in accordance with the present invention, the multi-port memory device can perform the preemption burst write operation as well as the normal write operation by generating the write clock which is toggled only when the write data are applied.

Also, the multi-port memory device can be linked with a plurality of multimedia devices and be easy to allocate a large amount of memory to a specific multimedia device having a higher ratio of memory utilization, thereby performing an efficient write operation.

Further, the multi-port memory device can flexibly handle the no operation command "NOP" or other commands unless the write command is applied, thereby stably performing the write operations. Accordingly, it is possible to perform a data process quickly and efficiently.

The present application contains subject matter related to Korean patent application Nos. 2005-90839 & 2006-79676, filed in the Korean Intellectual Property Office on Sep. 28, 2005 and Aug. 23, 2006, the entire contents of which are incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A multi-port memory device having a bank controller for controlling a parallel I/O communication between a plurality of ports and a plurality of banks, the multi-port memory device comprising:
   a write control unit for generating a write flag signal group and a write driver enable signal in response to a write command and a write clock selectively toggled only while write data are applied;
   a receiver for generating a write data frame including burst write data and a burst write command by selectively receiving parallel data from the ports;
   a data latch unit for outputting intermediate write data by storing the burst write data under control of the write flag signal group;
   a write data mask signal storage unit for receiving the burst write data and the burst write command to generate the data mask signal group in response to the write flag signal group; and
   a write driver for receiving the intermediate write data output from the data latch unit to write final write data to a memory cell of a corresponding bank in response to the write driver enable signal and the data mask signal group.

2. The multi-port memory device as recited in claim 1, further comprising a write clock generating unit for generating the write clock, the write clock generating unit includes:
   a first inverter for inverting a COMMAND bit of the burst write command;
   a logic gate for performing a NAND operation on an internal clock and an output of the first inverter; and
   a second inverter for inverting an output of the logic gate to output the write clock.

3. The multi-port memory device as recited in claim 1, wherein the receiver includes:
   a multiplexing unit including a plurality of multiplexers, each for receiving a corresponding bit of the parallel data input from the ports under the control of a bank selection signal for selecting a corresponding one of the banks; and
   a flip-flop unit including a plurality of flip-flops, each for latching an output signal of a corresponding one of the multiplexers in response to an internal clock to output the write data frame including the burst write data and the burst write command.

4. The multi-port memory device as recited in claim 3, wherein the burst write command is generated prior to the burst write data.

5. The multi-port memory device as recited in claim 3, wherein each of the flip-flops includes:
   a first inverter for inverting the output signal of the corresponding one of the multiplexers;
   the first transfer gate for selectively outputting an output of the first inverter in response to the internal clock;
   a first latch for latching an output of the first transfer gate to output the burst write command;
   a second inverter for inverting an output of the first latch;
   a second transfer gate for selectively outputting an output of the second inverter in response to the internal clock; and
   a second latch for latching an output of the second transfer gate to output the burst write data frame.

6. The multi-port memory device as recited in claim 3, wherein the write control unit includes:
   a shift register starter for starting an operation of a shift register based on the write command and the write clock;
   the shift register for outputting a write strobe signal group by aligning an output signal of the shift register starter to the write clock;
   a data latch controller for generating a final write signal and the write flag signal group based on the write strobe signal group; and
   a write signal converter for generating the write driver enable signal by adjusting and delaying a bandwidth of the final write signal.

7. The multi-port memory device as recited in claim 6, wherein the shift register starter activates the operation of the shift register by enabling a first write strobe signal of the write strobe signal group based on the write command and the write clock.

8. The multi-port memory device as recited in claim 7, wherein the shift register starter includes:

a delay unit for delaying the write clock;
a first inverter for inverting an output of the delay unit;
a first logic gate for performing a NOR operation on the write clock and an output of the first inverter;
a first NMOS transistor, connected between a ground voltage terminal and a third node, having a gate for receiving an output of the first logic gate;
a second inverter for inverting the write command;
a PMOS transistor, connected between a power supply voltage terminal and the third node, having a gate for receiving an output of the second inverter;
a third inverter for inverting an inverted reset signal;
a second NMOS transistor, connected between the ground voltage terminal and the third node, having a gate for receiving an output of the third inverter
a latch for latching a signal at the third node; and
a fourth inverter for inverting an output of the latch to output the first write strobe signal of the write strobe signal group.

9. The multi-port memory device as recited in claim 7, wherein the shift register includes:
a first flip-flop for outputting a second write strobe signal of the write strobe signal group by aligning the first write strobe signal with the write clock;
a second flip-flop for outputting a third write strobe signal by aligning the second write strobe signal with the write clock; and
a third flip-flop for outputting a fourth write strobe signal by aligning the third write strobe signal with the write clock.

10. The multi-port memory device as recited in claim 9, wherein each of the first to third flip-flops includes:
a first transfer gate for selectively outputting a corresponding one of the write strobe signal group in response to the write clock;
a first latch, reset by a reset signal, for latching an output of the first transfer gate;
a second transfer gate for selectively outputting an output of the first latch in response to the write clock; and
a second latch for latching an output of the second transfer gate to output a corresponding one of the write strobe signal group.

11. The multi-port memory device as recited in claim 10, wherein the first latch includes:
a logic gate for performing a NAND gate on the reset signal and the output of the first transfer gate; and
an inverter for inverting an output of the logic gate to output the inverted signal to the logic gate.

12. The multi-port memory device as recited in claim 9, wherein the data latch controller includes:
a write flag signal generator for generating the write flag signal group which is sequentially activated and used as a control signal of the data latch unit; and
a write signal generator for generating the final write signal.

13. The multi-port memory device as recited in claim 2, wherein the write flag signal generator includes:
a first write flag signal generator for generating a first write flag signal of the write flag signal group based on a first write strobe signal and the write clock;
a second write flag signal generator for generating a second write flag signal of the write flag signal group based on the second write strobe signal and the write clock;
a third write flag signal generator for generating a third write flag signal of the write flag signal group based on the third write strobe signal and the write clock; and
a fourth write flag signal generator for generating a fourth write flag signal of the write flag signal group based on the fourth write strobe signal and the write clock.

14. The multi-port memory device as recited in claim 13, wherein each of the first to fourth write flag signal generators includes:
a logic gate for performing a NAND operation of the write clock and the corresponding write strobe signal; and
an inverter for inverting an output of the logic gate to output the corresponding write flag signal.

15. The multi-port memory device as recited in claim 12, wherein the write signal generator includes:
a logic gate for performing a NAND operation of the write clock and the fourth write strobe signal; and
an inverter for inverting an output of the logic gate to output the final write signal.

16. The multi-port memory device as recited in claim 6, wherein the data latch unit includes:
a first data latch unit for latching the burst write data under the control of a first write flag signal of the write flag signal group;
a second data latch unit for latching the burst write data under the control of a second write flag signal;
a third data latch unit for latching the burst write data under the control of a third write flag signal; and
a fourth data latch unit for latching the burst write data under the control of a fourth write flag signal.

17. The multi-port memory device as recited in claim 16, wherein each of the first to fourth data latch units includes:
an inverter for inverting a corresponding one of the write flag signal group;
a first PMOS transistor, connected to a fourth node, having a gate for receiving an output of the inverter;
a first NMOS transistor, connected to the fourth node, having a gate for receiving the corresponding one of the write flag signal group;
a second PMOS transistor, connected between a power supply voltage terminal and the first PMOS transistor, having a gate for receiving the burst write data;
a second NMOS transistor, connected between a ground voltage terminal and the first NMOS transistor, having a gate for receiving the burst write data; and
a latch for latching a signal at the fourth node to output the intermediate write data.

18. The multi-port memory device as recited in claim 16, wherein the write data mask signal storage unit includes:
an upper data mask (UDM) registering unit for storing the burst write command to output an intermediate UDM signal group for determining whether upper bits of the final write data is written to the memory cell in response to the write command;
a UDM transferring unit for receiving the intermediate UDM signal to output the UDM signal to the write driver in response to a most significant bit (MSB) of the write flag signal group; and
a lower data mask (LDM) transferring unit for outputting the LDM signal for determining whether lower bits of the final write data are written to the memory cell to the write driver in response to the write flag signal group.

19. The multi-port memory device as recited in claim 18, wherein the UDM registering unit includes:
a first UDM register for storing a first UDM bit of the burst write command and outputting a first intermediate UDM signal of the intermediate UDM signal group in response to the write command;
a second UDM register for storing a second UDM bit of the burst write command and outputting a second intermediate UDM signal of the intermediate UDM signal group in response to the write command;

a third UDM register for storing a third UDM bit of the burst write command and outputting a third intermediate UDM signal of the intermediate UDM signal group in response to the write command; and a fourth UDM register for storing a fourth UDM bit of the burst write command and outputting a fourth intermediate UDM signal of the intermediate UDM signal group in response to the write command.

20. The multi-port memory device as recited in claim 19, wherein each of the first to fourth UDM registers includes:
    a first transfer gate for selectively outputting a corresponding UDM bit of the burst write command in response to an inverted write command;
    a first latch for latching an output of the first transfer gate;
    a second transfer gate for selectively outputting an output of the first latch in response to the write command; and
    a second latch for latching an output of the second transfer gate.

21. The multi-port memory device as recited in claim 19, wherein the LDM transferring unit includes:
    a first LDM unit for transferring a first bit of the LDM signal to the write driver in response to a first write flag signal of the write flag signal group;
    a second LDM unit for transferring a second bit of the LDM signal to the write driver in response to a second write flag signal of the write flag signal group;
    a third LDM unit for transferring a third bit of the LDM signal to the write driver in response to a third write flag signal of the write flag signal group; and
    a fourth LDM unit for transferring a fourth bit of the LDM signal to the write driver in response to a fourth write flag signal of the write flag signal group.

22. The multi-port memory device as recited in claim 21, wherein each of the first to fourth LDM units includes:
    a first inverter for inverting a corresponding one of the write flag signal group;
    a first PMOS transistor, connected to a second node, having a gate for receiving an output of the first inverter;
    a first NMOS transistor, connected to the second node, having a gate for receiving the corresponding write flag signal;
    a second PMOS transistor, connected between a power supply voltage terminal and the first PMOS transistor, having a gate for receiving a corresponding one of the burst write command;
    a second NMOS transistor, connected between a ground voltage terminal and the first NMOS transistor, having a gate for receiving the corresponding one of the burst write command;
    a second inverter for inverting a reset signal;
    a third PMOS transistor, connected between the second node and the power supply voltage terminal, having a gate for receiving an output of the second inverter; and
    a latch for latching a signal at the second node to output a corresponding bit of the LDM signal.

23. The multi-port memory device as recited in claim 21, wherein the UDM transferring unit includes:
    a first UDM unit for transferring a first bit of the UDM signal to the write driver in response to the fourth write flag signal of the write flag signal group;
    a second UDM unit for transferring a second bit of the UDM signal to the write driver in response to the fourth write flag signal;
    a third UDM unit for transferring a third bit of the UDM signal to the write driver in response to the fourth write flag signal; and
    a fourth UDM unit for transferring a fourth bit of the UDM signal to the write driver in response to the fourth write flag signal.

24. The multi-port memory device as recited in claim 23, wherein each of the first to fourth UDM units includes:
    a first inverter for inverting the fourth write flag signal;
    a first PMOS transistor, connected to a second node, having a gate for receiving an output of the first inverter;
    a first NMOS transistor, connected to the second node, having a gate for receiving the fourth write flag signal;
    a second PMOS transistor, connected between a power supply voltage terminal and the first PMOS transistor, having a gate for receiving a corresponding one of the intermediate UDM signal group;
    a second NMOS transistor, connected between the ground voltage terminal and the first NMOS transistor, having a gate for receiving the corresponding one of the intermediate UDM signal group; a second inverter for inverting a reset signal;
    a third PMOS transistor, connected between the second node and the power supply voltage terminal, having a gate for receiving an output of the second inverter; and
    a latch for latching a signal at the second node to output a corresponding bit of the UDM signal.

* * * * *

UNITED STATES PATENT AND TRADEMARK OFFICE
CERTIFICATE OF CORRECTION

| | | |
|---|---|---|
| PATENT NO. | : 7,447,095 B2 | Page 1 of 1 |
| APPLICATION NO. | : 11/529202 | |
| DATED | : November 4, 2008 | |
| INVENTOR(S) | : Kim et al. | |

It is certified that error appears in the above-identified patent and that said Letters Patent is hereby corrected as shown below:

Col. 15, in Claim 13, line 1, please delete "2" and insert -- 12 --.

Signed and Sealed this

Nineteenth Day of May, 2009

JOHN DOLL
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 7,447,095 B2 | Page 1 of 1 |
| APPLICATION NO. | : 11/529202 | |
| DATED | : November 4, 2008 | |
| INVENTOR(S) | : Kim et al. | |

It is certified that error appears in the above-identified patent and that said Letters Patent is hereby corrected as shown below:

Col. 15, in Claim 13, line 57, please delete "2" and insert -- 12 --.

This certificate supersedes the Certificate of Correction issued May 19, 2009.

Signed and Sealed this

Ninth Day of June, 2009

JOHN DOLL
*Acting Director of the United States Patent and Trademark Office*